(12) United States Patent
Liu et al.

(10) Patent No.: US 8,900,966 B2
(45) Date of Patent: Dec. 2, 2014

(54) ALIGNMENT FOR BACKSIDE ILLUMINATION SENSOR

(71) Applicant: Taiwan Semiconductor Manufacturing Company, Ltd., Hsin-Chu (TW)

(72) Inventors: Jen-Cheng Liu, Hsin-Chu (TW);
Dun-Nian Yaung, Taipei (TW);
Shou-Gwo Wuu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/044,716

(22) Filed: Oct. 2, 2013

(65) Prior Publication Data

US 2014/0094016 A1 Apr. 3, 2014

Related U.S. Application Data

(60) Continuation of application No. 13/550,140, filed on Jul. 16, 2012, now Pat. No. 8,558,351, which is a continuation of application No. 12/553,586, filed on Sep. 3, 2009, now Pat. No. 8,227,899, which is a division of application No. 11/951,916, filed on Dec. 6, 2007, now Pat. No. 7,588,993.

(51) Int. Cl.
*H01L 23/544* (2006.01)
*H01L 21/71* (2006.01)

(52) U.S. Cl.
CPC ....... *H01L 23/544* (2013.01); *H01L 2223/5446* (2013.01); *H01L 21/71* (2013.01); *H01L 2223/54453* (2013.01); *H01L 2223/54426* (2013.01); *H01L 2924/3011* (2013.01)

USPC .................... 438/401; 438/459; 257/E21.211

(58) Field of Classification Search
USPC ............ 438/401, 459; 257/E21.536, E21.211
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,733,801 A * | 3/1998 | Gojohbori | 438/401 |
| 5,767,001 A | 6/1998 | Bertagnolli et al. | |
| 5,909,050 A | 6/1999 | Furey et al. | |
| 5,950,093 A | 9/1999 | Wei | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,440,816 B1 | 8/2002 | Farrow et al. | |
| 6,448,168 B1 | 9/2002 | Rao et al. | |
| 6,462,428 B2 | 10/2002 | Iwamatsu | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,614,102 B1 | 9/2003 | Hoffman et al. | |
| 6,639,303 B2 | 10/2003 | Siniaguine et al. | |
| 6,664,129 B2 | 12/2003 | Siniaguine et al. | |
| 6,693,361 B1 | 2/2004 | Siniaguine et al. | |
| 6,740,582 B2 | 5/2004 | Siniaguine | |

(Continued)

*Primary Examiner* — Roy Potter
(74) *Attorney, Agent, or Firm* — Haynes and Boone, LLP

(57) ABSTRACT

Provided is an apparatus that includes an integrated circuit located in a first region of a substrate having first and second opposing major surfaces and an alignment mark located in a second region of the substrate and extending through the substrate between the first and second surfaces.

20 Claims, 10 Drawing Sheets

(56) References Cited

U.S. PATENT DOCUMENTS

| | | |
|---|---|---|
| 6,800,930 B2 | 10/2004 | Jackson et al. |
| 6,841,883 B1 | 1/2005 | Farnworth et al. |
| 6,869,861 B1 | 3/2005 | Glenn et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,227,240 B2 | 6/2007 | Knapp et al. |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,588,993 B2 | 9/2009 | Liu et al. |
| 8,227,899 B2 | 7/2012 | Liu et al. |
| 2012/0280351 A1 | 11/2012 | Liu et al. |

\* cited by examiner

ALIGNMENT FOR BACKSIDE ILLUMINATION SENSOR

This application is a Continuation of U.S. patent application Ser. No. 13/550,140, filed Jul. 16, 2012, which is a Continuation of U.S. patent application Ser. No. 12/553,586, filed Sep. 3, 2009, now U.S. Pat. No. 8,227,899, which is a Divisional of and claims priority to U.S. patent application Ser. No. 11/951,916, filed Dec. 6, 2007, now U.S. Pat. No. 7,588,993, each of which is hereby incorporated by reference in its entirety.

BACKGROUND

When fabricating an integrated circuit, it is important that each patterned layer be aligned with the previously formed layer or layers, at least within some permissible tolerance. For example, to align the various layers, a substrate having a photoresist applied thereon is placed in a photolithographic chamber, such as a "stepper" or "scanner." A mask or reticle is then used to pattern the photoresist. As the patterned photoresist ultimately dictates the positioning of the underlying circuit layer to be etched, its alignment is critical.

To bring the substrate into alignment with the mask, an image of some structure on the mask and some structure on the wafer are compared using optical analysis equipment, for example. If alignment is needed, the optical analysis equipment can control the lateral and/or rotational positioning of the substrate. Such alignment is usually assessed at numerous locations around the substrate's perimeter, which accordingly requires reference to a plurality of alignment marks on the substrate.

Although alignment structures can constitute a portion of the circuit being fabricated, a dedicated structure separate from the circuit and known as an alignment mark is usually formed for this purpose. Such alignment marks are typically formed outside of the active integrated circuit area on the wafer, such as in the area in which the substrate will be scribed or "diced" for later insertion into packages.

However, such alignment marks may become covered with opaque materials during later processing steps, making them difficult to detect with the optical analysis equipment. Accordingly, the prior art has experimented with the use of backside alignment marks, which are located on the opposite side of the substrate from the front side where the active circuitry is formed. However, with existing backside alignment marks, extreme care must be taken to protect the near-perfectly smooth front side of the substrate. Moreover, existing backside alignment marks require extensive preparation (e.g., protective layer formation, photoresist deposition, patterning and removal, etching, removal of these layers, etc.) before processing of the circuit on the front of the substrate can begin in earnest.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
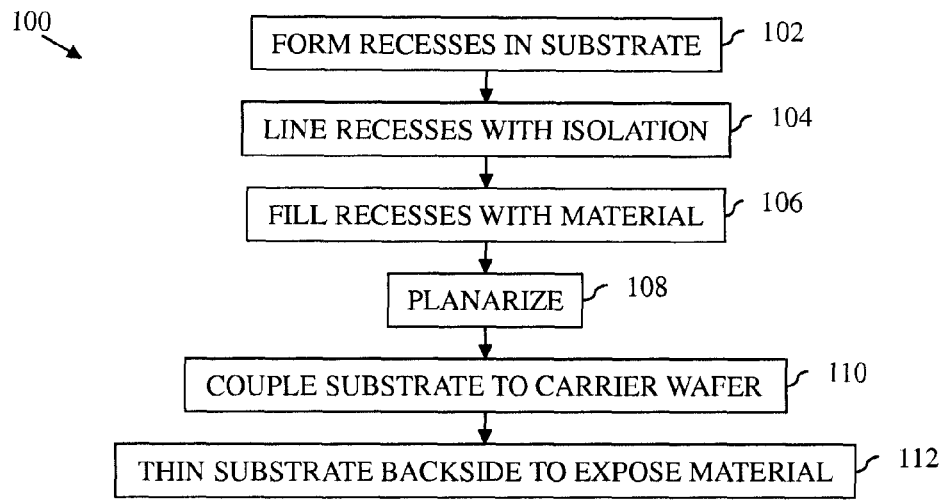
FIG. 1A is a flow-chart diagram of at least a portion of a method according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1A, illustrated is a flow-chart diagram of at least a portion of a method 100 according to one or more aspects of the present disclosure. The method 100 may be, include, or be included in a method of forming an alignment mark within the scope of the present disclosure, and may incorporate one or more aspects of one or more methods depicted in other figures of the present disclosure. The method 100 may be integrated into or otherwise utilized in conjunction with back-end-of-the-line ("BEOL") processing, as described below.

The method 100 includes a step 102 comprising forming one or more recesses in a silicon substrate and/or other semiconductor wafer. The substrate includes first and second opposing major surfaces. One or more transistors may be located in a first region of the first surface, and the recesses formed during step 102 may be formed in a second region of the first surface. For example, the first region may be an active region in which the active circuitry being formed are located, whereas the second region may not include any of such active circuitry, such as where the second region at least partially coincides with a scribe region or dicing lane of the substrate or wafer.

The recesses may each individually have a circular, rectangular, elongated, or other shape or pattern, and may be collectively grouped in a grid, array, circlar, rectangular, elongated, or other regular or irregular shape or pattern. Where more than one recess is locally formed in a particular region, the plurality of recesses may include four, sixteen, or any other number of recesses.

An optional step 104 of the method 100 comprises lining the recesses with an isolation material, such as to electrically isolate the alignment marks to be formed in the recesses from any surrounding circuitry, to prevent diffusion to and/or from the alignment marks, to encourage adhesion of the alignment marks within the recesses, and/or for other purposes. The method 100 also includes a step 106 comprising filling the lined or unlined recesses with a fill material. The fill material may comprise tungsten, other electrically conductive materials, and/or other materials.

In a subsequent step 108, a planarization process is performed to remove any excess portions of the fill material. For example, step 108 may comprise one or more of a chemical-mechanical planarization (CMP) process, a wet-etching process, and a dry-etching process, among others. The planarization process may utilize a previously deposited layer as a stopping point, although time and/or other operating parameters/characteristics may alternatively or additionally be employed to control the stopping point of planarization.

The method 100 also includes a step 110 comprising coupling the substrate to an additional substrate or wafer (e.g., a carrier wafer) by wafer bonding and/or one or more other processes. For example, the initial substrate may be flipped such that the surface in which the alignment marks are recessed can be bonded to the additional substrate. The substrate surface in which the alignment marks are recessed may be bonded directly to the additional substrate, or one or more bonding layers formed on one or both of the substrates may also be employed to couple the substrates together.

In a subsequent step 112, the substrate in which the alignment marks are formed is thinned, such as by planarizing the backside surface of the substrate, at least until the alignment mark material in the recesses is exposed. Thinning of the substrate may be accomplished via one or more of CMP, a grinding process, a wet or dry etching process, and/or others. The thinning process may be configured such that the alignment marks are not only exposed, but also protrude or extend from the reduced backside surface of the substrate. For example, configuring the alignment marks to protrude from the backside surface to a distance ranging between about 5 nm and about 2000 nm may enhance the optical detection characteristics of the alignment marks. In one such embodiment, the fill material employed to form the alignment marks may have a higher resistance to CMP, etching, or other planarizing process, relative to a bulk portion of at least one of the substrates. Nonetheless, the thinning process may alternatively be configured such that the exposed surfaces of the alignment marks are substantially coplanar with the thinned backside surface of the substrate.

Figure 1B:
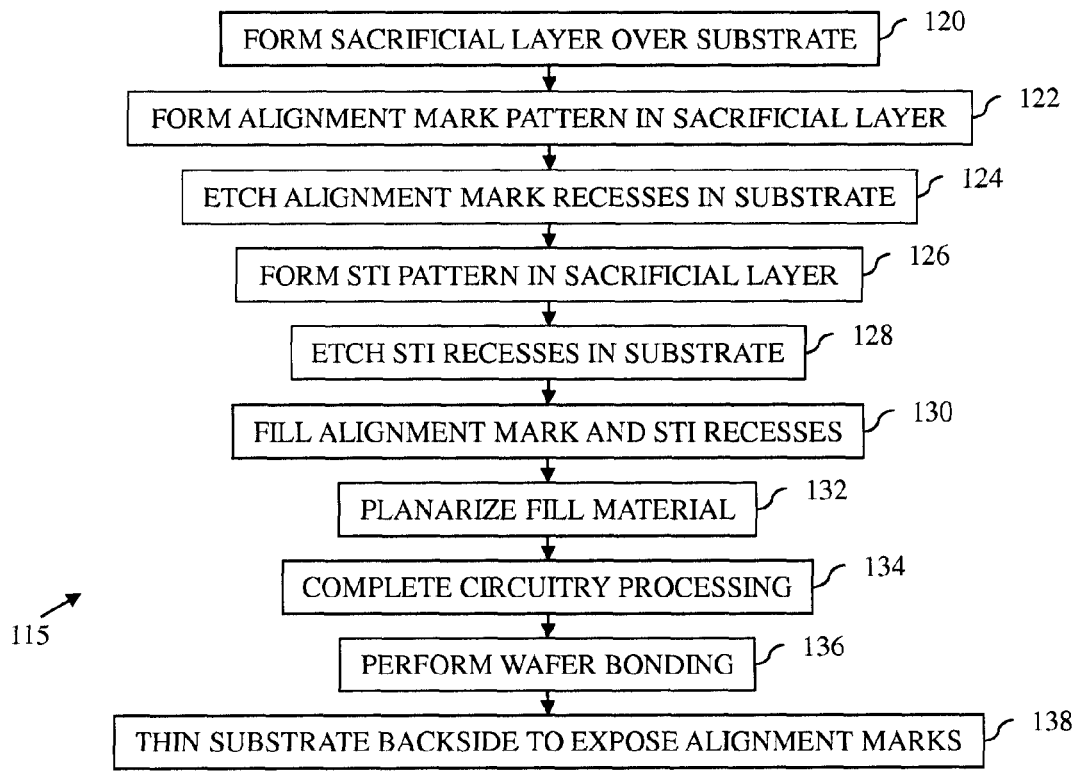
FIG. 1B is a flow-chart diagram of at least a portion of a method according to one or more aspects of the present disclosure.

Referring to FIG. 1B, illustrated is a flow-chart diagram of at least a portion of a method 115 according to one or more aspects of the present disclosure. The method 115 may be, include, or be included in a method of forming an alignment mark within the scope of the present disclosure, and may incorporate one or more aspects of one or more methods depicted in other figures of the present disclosure. One or more aspects of the method 115 may be substantially similar to one or more aspects of the method 100 shown in FIG. 1A. In fact, embodiments of methods within the scope of the present disclosure may include one or more steps or other aspects of the method 100 shown in FIG. 1A in combination with one or more steps or other aspects of the method 115 shown in FIG. 1B. The method 115 may be integrated into or otherwise utilized in conjunction with front-end-of-the-line ("FEOL") processing, as described below.

The method 115 include a step 120 which comprises depositing or otherwise forming a layer over a silicon substrate or other semiconductor wafer. The layer may be a sacrificial layer, in that it may be formed only temporarily for manufacturability purposes but may be completely removed during one or more later stages of manufacture.

During a subsequent step 122, an alignment mark pattern is formed in the layer of step 120. For example, the alignment mark pattern may comprise one or more apertures each extending through the layer of step 120 and thereby exposing the underlying surface of the substrate. Each aperture may individually have a circular shape or pattern, such that the aperture forms a substantially cylindrical void in the layer. Alternatively, each aperture may individually have a shape or pattern that is rectangular, elongated, or otherwise noncircular. Where the alignment mark pattern comprise more than one aperture, the plurality of apertures may be collectively grouped in an grid, line, circular pattern, or other pattern.

The method 115 also includes a step 124 comprising etching the substrate through one or more of the apertures of step 122 to form one or more alignment mark recesses extending into the substrate. For example, the layer comprising the alignment mark pattern may be utilized as a mask such that one or more of the apertures formed in the layer may be transferred to the substrate as one or more corresponding alignment mark recesses.

During a subsequent step 126, a shallow trench isolation (STI) pattern is formed in the layer of step 120. For example, the STI pattern may comprise one or more apertures each extending through the layer of step 120 and thereby exposing the underlying surface of the substrate. Each aperture may individually have a circular, rectangular, or other shape or pattern.

The method 115 also includes a step 128 comprising etching the substrate through one or more of the apertures of step 126 to form one or more STI recesses extending into the substrate. For example, the layer comprising the STI pattern (and the alignment mark pattern) may be utilized as a mask such that one or more of the apertures formed in the layer may be transferred to the substrate as one or more corresponding STI recesses. Alternatively, the layer employed as a mask to form the alignment mark recesses may be removed or plugged, and a subsequently formed layer may be formed and patterned for subsequent use as an additional mask when forming the STI recesses. In either case, formation of the alignment mark recesses of step 124 and the STI recesses of step 128 may be configured such that the alignment mark recesses have a first depth, whereas the STI recesses have a second depth that is substantially less than the first depth. For example, the depth of the alignment mark recesses may be two, three, five, or ten or more times greater than the depth of the STI recesses. The STI recesses may have a depth that is substantially conventional with regard to the formation of STI features, whereas the alignment mark recesses may extend a substantially greater distance into the substrate.

The patterning performed during steps 122 and 124 to form the alignment mark recesses and the patterning performed during steps 126 and 128 to form the STI recesses may be configured such that the STI recesses are formed in a first region of the substrate whereas the alignment mark recesses are formed in a second region of the substrate. For example, the first region may be an active region in which the active circuitry being formed is located, whereas the second region may not include any of such active circuitry, such as where the second region at least partially coincides with a scribe region or dicing lane of the substrate or wafer.

In a subsequent step 130, the alignment mark recesses of step 124 and the STI recesses of step 128 are filled with a material. The material may comprise one or more dielectric materials, such as silicon dioxide, among others. The method 115 may also include an optional step comprising lining the alignment mark recesses of step 124 and/or the STI recess of step 128 with one or more lining layers prior to filling the recesses. For example, such lining material may be configured to improve the adhesion of the fill material within the recesses, to prevent diffusion between the fill material and the substrate, and/or to adjust the conductivity/resistivity of the alignment mark or STI features, among other purposes within the scope of the present disclosure.

A subsequent step 132 comprises planarizing the material filling the alignment mark recesses and/or the STI recesses, such as to remove any excess fill material from above the recesses or the substrate surface in which the recesses were formed. Such planarizing may comprise one or more of CMP, wet-etching, dry-etching, and/or other material removal processes.

The method 115 may further comprise a number of subsequent steps employed to complete fabrication of the circuitry being formed in the substrate, such as to form one or more transistors or other active or passive circuit elements between ones of the STI features. For example, an integrated circuit may be formed by conventional or future-developed complementary metal-oxide-semiconductor (CMOS) and interconnect structure fabrication processing, wherein cells defined between ones of the STI features comprise positive MOS (PMOS) and negative MOS (PMOS) transistor devices in an alternating fashion.

Thereafter, in a subsequent step 136, the substrate is bonded or otherwise coupled to an additional substrate or wafer (e.g., a carrier wafer) by wafer bonding and/or one or more other processes. For example, the initial substrate may be flipped such that the surface in which the alignment marks and STI features are recessed can be bonded to the additional substrate. The substrate surface in which the alignment marks and STI features are recessed may be bonded directly to the additional substrate, or one or more bonding layers formed on one or both of the substrates may also be employed to couple the substrates together.

In a subsequent step 138, the substrate in which the alignment marks, STI features, and circuitry are formed is thinned by planarizing the backside surface of the substrate, at least until the alignment marks are exposed. Thinning of the substrate may be accomplished via one or more of CMP, grinding, wet or dry etching, and/or other processes. The thinning process may be configured such that the alignment marks are not only exposed, but also protrude or extend from the reduced backside surface of the substrate. For example, configuring the alignment marks to protrude from the backside surface to a distance ranging between about 5 nm and about 2000 nm may enhance the optical detection characteristics of the alignment marks. In one such embodiment, the fill material employed to form the alignment marks may have a higher resistance to CMP, etching, or other planarizing process, relative to a bulk portion of at least one of the substrates. Nonetheless, the thinning process may alternatively be configured such that the exposed surfaces of the alignment marks are substantially coplanar with the thinned backside surface of the substrate.

As described above, the layer formed during step 120 may actually comprise one or more sacrificial layers formed temporarily for utilization as masking during formation of the alignment mark recesses and/or the STI recesses. Consequently, the method 115 may further comprise removing the one or more layers. Such removal of one or both of the layers may be performed before formation of an additional layer over the alignment marks and/or STI features (e.g., a layer utilized for wafer bonding), before coupling the two substrates together, or before thinning the backside surface of the substrate having the integrated circuit.

After the removal of one or both of the layers, the material in each of the alignment mark recesses and the STI recesses (i.e., the alignment marks and the STI features) may protrude from the substrate in a first direction and the material in the alignment mark recesses may protrude from the substrate in a second direction that is substantially opposite to the first direction. That is, for example, the alignment marks may extend from the backside surface of the substrate, whereas both the alignment marks and the STI features may extend from the opposite or "front" surface of the substrate. Alternatively, the STI features alone may extend from the front surface of the substrate, or the alignment marks may alone extend from the front surface of the substrate, regardless of whether or not the alignment marks also extend from the backside surface of the substrate.

Figure 2A:
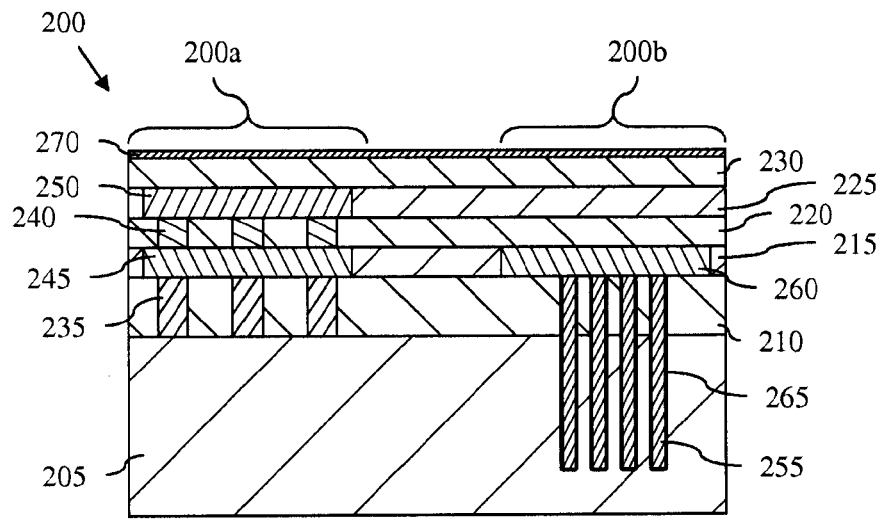
FIG. 2A is a sectional view of at least a portion of apparatus in an intermediate stage of manufacture according to one or more aspects of the present disclosure.
Figure 2B:
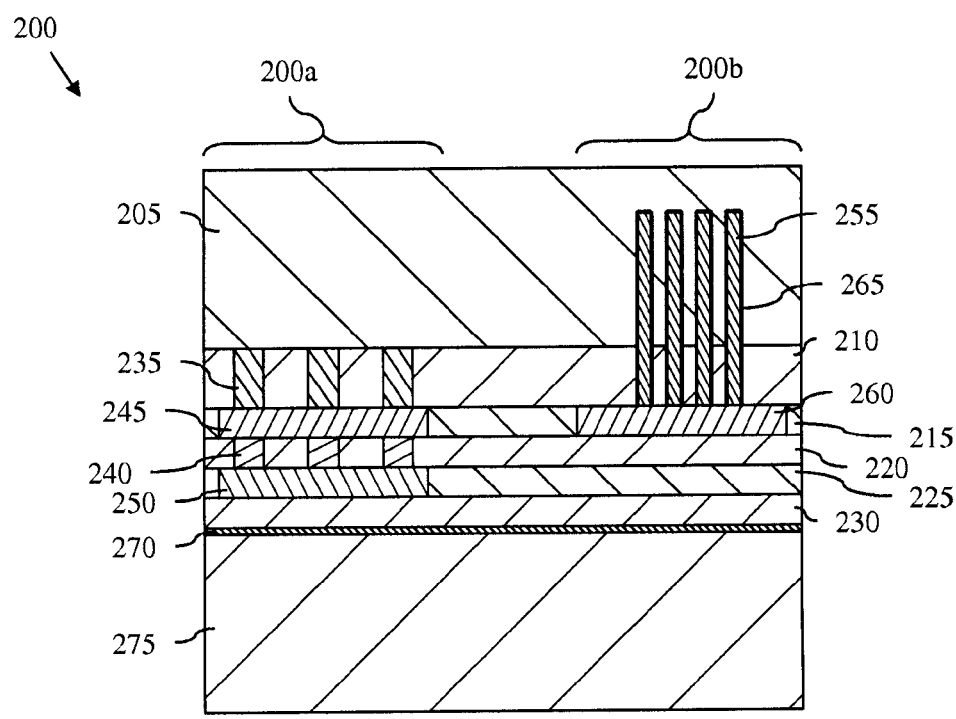
FIG. 2B is a sectional view of the apparatus shown in FIG. 2A in a subsequent stage of manufacture according to one or more aspects of the present disclosure.
Figure 2C:
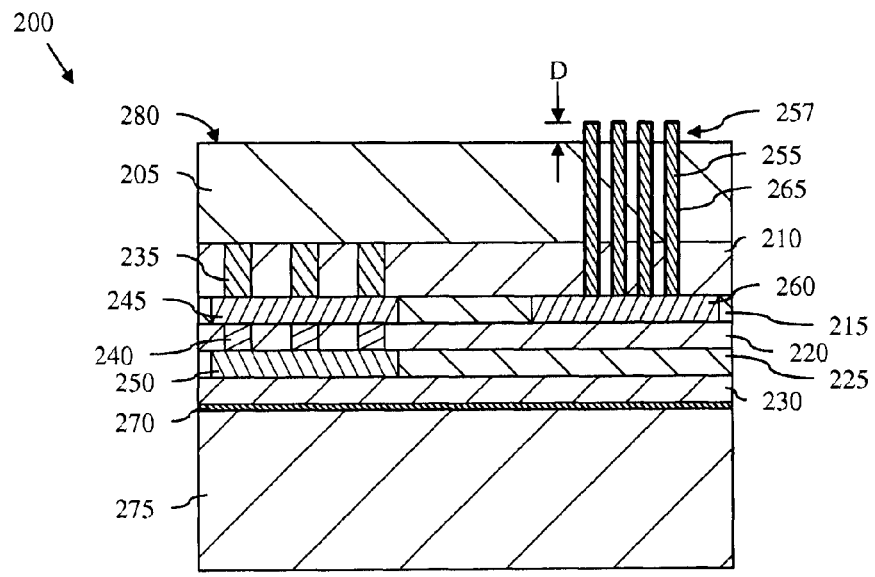
FIG. 2C is a sectional view of the apparatus shown in FIG. 2B in a subsequent stage of manufacture according to one or more aspects of the present disclosure.

FIG. 2A is a sectional view of at least a portion of apparatus 200 in an intermediate stage of manufacture according to one or more aspects of the present disclosure. FIGS. 2B and 2C are sectional views of the apparatus 200 shown in FIG. 2A in subsequent stages of manufacture. The apparatus 200 may be formed by a manufacturing method having one or more steps and/or other aspects of the method 100 shown in FIG. 1A and/or the method 115 shown in FIG. 1B.

The apparatus 200 includes one or more circuit regions 200a and one or more alignment mark regions 200b. The circuit regions 200a each or collectively comprise one or more integrated circuits including a plurality of transistors, other active circuit components, and/or passive circuit components (e.g., resistive elements) interconnected by an interconnect structure. Such circuits may be conventional or future-developed. The alignment mark regions 200b may or may not include such circuits or circuit components, but each do include one or more alignment or overlay marks (herein collectively referred to as alignment marks, although merely for the sake of simplicity and without implying any limitation). One or more of the alignment mark regions 200b may at least partially, if not substantially, coincide with scribe regions (also known as dicing lanes), such that any features formed in the alignment mark regions 200b may be destroyed during the one or more scribing or dicing processes employed to separate the circuit regions 200a prior to packaging.

In the stage of manufacture depicted in FIG. 2A, one or more integrated circuits have already been at least partially formed in the circuit region 200a of substrate 205. For example, source/drain regions, doped wells, and/or other components of the circuits may already be defined in the substrate 205 by conventional or future-developed fabrication processes. Such components may already be partially or completely interconnected by an interconnect structure formed by conventional or future-developed fabrication processes. Alternatively, all or a portion of the interconnect structure may be formed simultaneously with and/or after the alignment marks and/or other features described below. Thus, the alignment mark manufacturing method depicted in FIGS. 2A-2C may be applicable or readily adaptable to "back-end-of-the-line" (or "BEOL") processing. In this context, the apparatus 200a shown in FIGS. 2A-2C represent an exemplary implementation of the method 100 shown in FIG. 1A. The manufacturing steps depicted in FIGS. 2A-2C and/or described above with reference to the method 100 shown in FIG. 1A may thus, in an exemplary embodiment, be configured to be easily integrated into existing BEOL processing, among other semiconductor apparatus fabrication processing.

Referring to FIG. 2A, the apparatus 200 also includes dielectric layers 210, 215, 220, 225, 230, conductive vias 235, 240, conductive interconnects 245, 250, alignment marks 255, and conductive member 260. The dielectric layers 210, 215, 220, 225, 230 may comprise silicon dioxide, fluorosilicate glass (FSG), phosphosilicate glass (PSG), low-k dielectric materials, other conventional inter-metal dielectric (IMD) materials, and/or other dielectric materials, and may be deposited by chemical-vapor deposition (CVD), physical-vapor deposition (PVD), high density plasma (HDP) deposition, plasma-enhanced CVD (PECVD), and/or other processes. Although not shown in FIG. 2A, one or more antireflective coating (ARC) and/or bottom-ARC (BARC) layers may be formed between neighboring ones of the dielectric layers 210, 215, 220, 225, 230.

The conductive vias 235, 240 and conductive interconnects 245, 250 may each comprise tungsten, copper, and/or other conductive materials, and may be deposited by CVD and/or other processes into corresponding recesses and apertures in the dielectric layers 210, 215, 220, 225, 230. Although not shown in FIG. 2A, one or more layers comprising titanium, titanium nitride, and/or other materials may be formed prior to forming one or more of the conductive vias 235, 240 and/or conductive interconnects 245, 250, such as to improve adhesion to surrounding portions of neighboring ones of the dielectric layers 210, 215, 220, 225, 230.

The alignment marks 255 and conductive member 260 may be substantially similar in composition and manufacture to the vias 235, 240 and/or interconnects 245, 250. However, as shown in FIG. 2A, formation of the alignment marks 255 may further comprise deposition of an isolation lining 265 prior to filling with tungsten and/or other conductive material. The isolation lining 265 may comprise titanium, titanium nitride, silicon nitride, silicon oxynitride, and/or other materials, and may be deposited by CVD, PVD, and/or other processes.

In an exemplary embodiment, the formation sequence of the features shown in FIG. 2A may be as follows: (1) dielectric layer 210 is formed over substrate 205 and then patterned to form apertures in circuit region 200a and alignment mark region 200b; (2) the apertures formed in dielectric layer 210 in alignment mark region 200b are lined with isolation lining 265; (3) the lined apertures in dielectric layer 210 in alignment mark region 200b and the apertures in dielectric layer 210 in circuit region 200a are filled with conductive material to form alignment marks 255 and vias 235; (4) vias 235 and alignment marks 255 are planarized, possibly with upper surface of dielectric layer 210; (5) dielectric layer 215 is formed and then patterned to form apertures in circuit region 200a and alignment mark region 200b, which are then filled to form conductive members 245, 260; (6) dielectric layer 220 is formed and then patterned to form apertures in circuit region 200a, which are then filled to form vias 240; (7) dielectric layer 225 is formed and then patterned to form an aperture in circuit region 200a, which is then filled to form conductive member 250; and (8) dielectric layer 230 is formed.

The apparatus 200 may also comprise a topmost layer 270 comprising oxide and/or other materials. The topmost layer 270 may be employed to facilitate subsequent wafer-to-wafer bonding. The topmost layer 270 may also replace or be the same as the dielectric layer 230.

Referring to FIG. 2B, illustrated is a sectional view of the apparatus 200 shown in FIG. 2A in a subsequent stage of manufacture in which the apparatus has been flipped (vertically, relative to the page) and coupled to a carrier wafer 275. Such coupling may be via one or more conventional or future-developed wafer bonding processes and/or other coupling methods, possibly including the use of one or more adhesives, chemical bond, thermal activation and/or curing, or ultrasonic bond, among others.

Referring to FIG. 2C, illustrated is a sectional view of the apparatus 200 shown in FIG. 2B in a subsequent stage of manufacture in which the backside surface 280 of the substrate 205 has been thinned to expose the previously buried end portions 257 of the alignment marks 255. Such thinning may be accomplished via one or more CMP, grinding, wet etching, dry etching, and/or other material removal processes. The thinning may be configured to expose the end portions 257 of the alignment marks 255 such that the end portions 257 are coplanar with the backside surface 280 of the substrate 205. However, as in the exemplary embodiment depicted in FIG. 2C, the thinning may alternatively be configured such that the end portions 257 extend or protrude from the backside surface 280 of the substrate 205 to a distance D. The distance D may range between about 5 nm and about 2000 nm, although other values are also within the scope of the present disclosure.

Figure 3A:
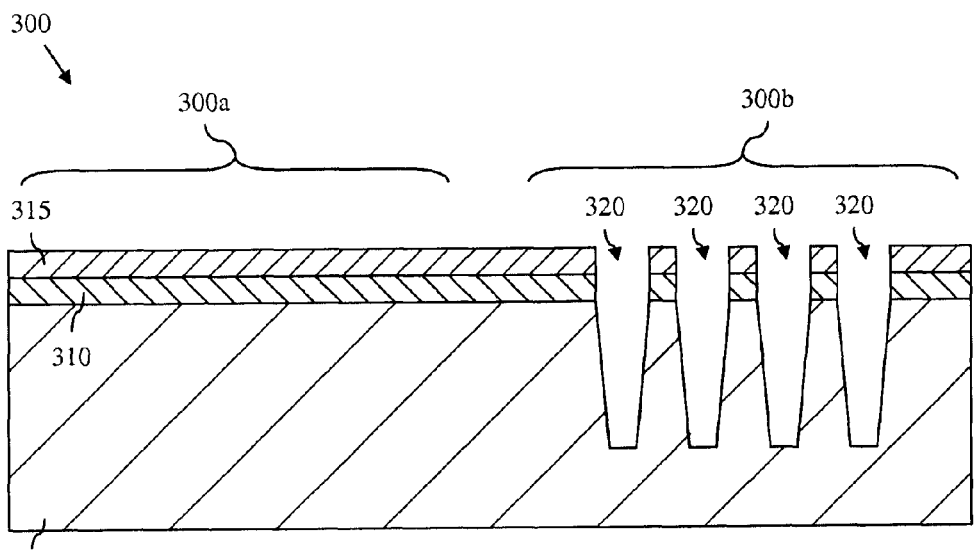
FIG. 3A is a sectional view of at least a portion of apparatus in an intermediate stage of manufacture according to one or more aspects of the present disclosure.

FIG. 3A is a sectional view of at least a portion of apparatus 300 in an intermediate stage of manufacture according to one or more aspects of the present disclosure. FIGS. 3B-3H are sectional views of the apparatus 300 shown in FIG. 3A in subsequent stages of manufacture. The apparatus 300 may be formed by a manufacturing method having one or more steps and/or other aspects of the method 100 shown in FIG. 1A and/or the method 115 shown in FIG. 1B.

The apparatus 300 includes one or more circuit regions 300a and one or more alignment mark regions 300b. The circuit regions 300a each or collectively comprise one or more integrated circuits including a plurality of transistors, other active circuit components, and/or passive circuit components (e.g., resistive elements) interconnected by an interconnect structure. Such circuits may be conventional or future-developed. The alignment mark regions 300b may or may not include such circuits or circuit components, but each will include one or more alignment marks. One or more of the alignment mark regions 300b may at least partially, if not substantially, coincide with scribe regions (also known as dicing lanes), such that any features formed in the alignment mark regions 300b may be destroyed during the one or more scribing or dicing processes employed to separate the circuit regions 300a prior to packaging.

In the stage of manufacture depicted in FIG. 3A, the one or more integrated circuits of the circuit region 300a have not yet been formed. For example, source/drain regions, doped wells, and/or other components of the circuits may not yet be defined in the substrate 305. Thus, the alignment mark manufacturing method depicted in FIGS. 3A-3H may be applicable or readily adaptable to "front-end-of-the-line" (or "FEOL") processing. In this context, the apparatus 300a shown in FIGS. 3A-3H represent an exemplary implementation of the method 115 shown in FIG. 1B. The manufacturing steps depicted in FIGS. 3A-3H and/or described above with reference to the method 115 shown in FIG. 1B may thus, in an exemplary embodiment, be configured to be easily integrated into existing FEOL processing, among other semiconductor apparatus fabrication processing.

Referring to FIG. 3A, the apparatus 300 also includes layers 310, 315 formed over the substrate 305. The substrate 305 may be substantially similar in composition and manufacture to the substrate 205 described above. The layers 310, 315 may comprise photoresist, silicon dioxide, FSG, PSG, low-k dielectric materials, other conventional IMD materials, and/or other dielectric materials, and may be deposited by CVD, PVD, HDP, PECVD, and/or other processes. The layers 310, 315 may be substantially similar in composition and manufacture to the dielectric layers shown in FIGS. 2A-2C and described above. However, in an exemplary embodiment, the layer 315 may be a photoresist layer or other mask configured to be utilized to form the alignment mark recesses 320 in the substrate 305. The layer 310 may also be configured as a sacrificial layer, such that it is only temporarily formed for manufacturability purposes but will later be completely removed. Also, although not shown in FIG. 3A, one or more ARC and/or BARC layers may be formed above or below one or both of the layers 310, 315.

As also shown in FIG. 3A, a plurality of alignment mark recesses 320 have been formed in the substrate 305, such as by patterning the layer 315 to form apertures therein and subsequently transferring the pattern of apertures through the layer 310 and into the substrate 305. For example, such patterning and pattern transfer may be accomplished via isotropic and/or anisotropic etching. The sidewalls of the alignment mark recesses 320 may be tapered, as shown in FIG. 3A, although in other embodiments the sidewalls of the alignment mark recesses 320 may be substantially perpendicular to the front surface of the substrate 305 and/or a surface of the layers 310, 315.

Figure 3B:
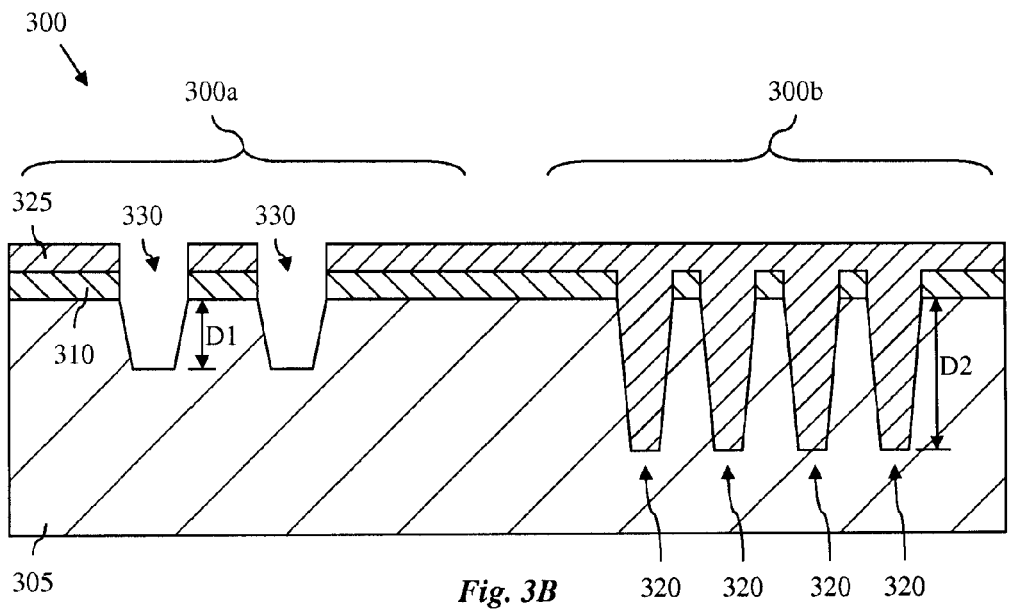
FIG. 3B is a sectional view of the apparatus shown in FIG. 3A in a subsequent stage of manufacture according to one or more aspects of the present disclosure.

Referring to FIG. 3B, illustrated is a sectional view of the apparatus 300 shown in FIG. 3A in a subsequent stage of manufacture in which the dielectric or photoresist layer 315 has been removed, another dielectric or photoresist layer 325 has been formed over the layer 310, and STI recesses 330 have been formed in the substrate 305. The layer 325 may be substantially similar in composition and manufacture to the layer 315 shown in FIG. 3A and described above. The STI recesses 330 may be formed by patterning the layer 325 to form apertures therein and subsequently transferring the pattern of apertures through the layer 310 and into the substrate 305. For example, such patterning and pattern transfer may be accomplished via isotropic and/or anisotropic etching. The sidewalls of the STI recesses 330 may be tapered, as shown in FIG. 3B, although in other embodiments the sidewalls may be substantially perpendicular to the front surface of the substrate 305 and/or a surface of the layers 310, 325.

As shown in FIG. 3B, the STI recesses 330 may have a depth D1 that is substantially less than a depth D2 of the alignment mark recesses 320. For example, the depth D2 may be two, three, five, or ten or more times greater than the depth D1. However, the specific relationship between the depth D1 and the depth D2 is not limited within the scope of the present disclosure. In an exemplary embodiment, the depth D2 of the alignment mark recesses 320 is configured such that a minimal or otherwise predetermined amount of wafer thinning will subsequently have to be performed to expose the alignment marks ultimately formed in the recesses 320. However, the depth D1 of the STI recesses 330 may be configured such that the wafer thinning that will be performed does not expose the ultimately-formed STI features through the backside surface of the substrate 305. In an exemplary embodiment, the depth D1 of the STI recesses 330 is just deep enough to provide the necessary electrical isolation between neighboring pairs of CMOS or other active device cells being formed in the circuit region 300a, although other depths are also within the scope of the present disclosure.

Figure 3C:
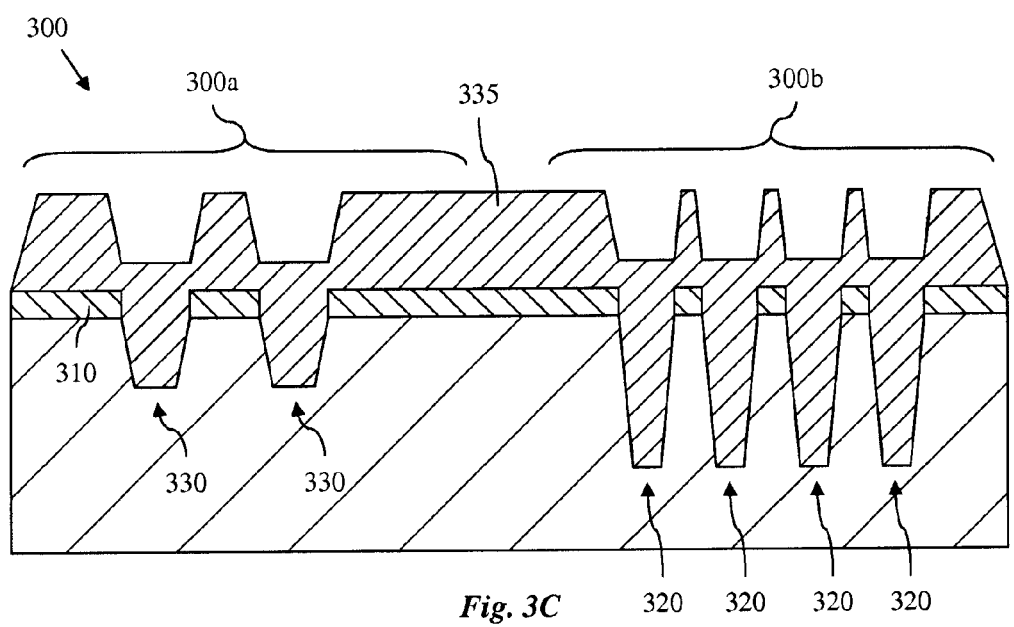
FIG. 3C is a sectional view of the apparatus shown in FIG. 3B in a subsequent stage of manufacture according to one or more aspects of the present disclosure.

Referring to FIG. 3C, illustrated is a sectional view of the apparatus 300 shown in FIG. 3B in a subsequent stage of manufacture in which the layer 325 has been removed and an insulating layer 335 has been formed in the alignment mark recesses 320 and the STI recesses 330, as well as over the layer 310. The insulating layer 335 may comprise silicon dioxide, FSG, PSG, low-k dielectric materials, other conventional IMD materials, and/or other dielectric materials, and may be deposited by CVD, PVD, HDP, PECVD, and/or other processes. The layer 335 may be substantially similar in composition and manufacture to the dielectric layers shown in FIGS. 2A-2C and described above. The layer 335 may be deposited in a manner configured to achieve a profile substantially conforming or otherwise corresponding to the aggregate profile of the upper surface of the layer 310 and the inside surfaces of the STI recesses 330 and the alignment recesses 320. Also, although not shown in FIG. 3B, one or more ARC and/or BARC layers may be formed above or below the layers 335.

Figure 3D:
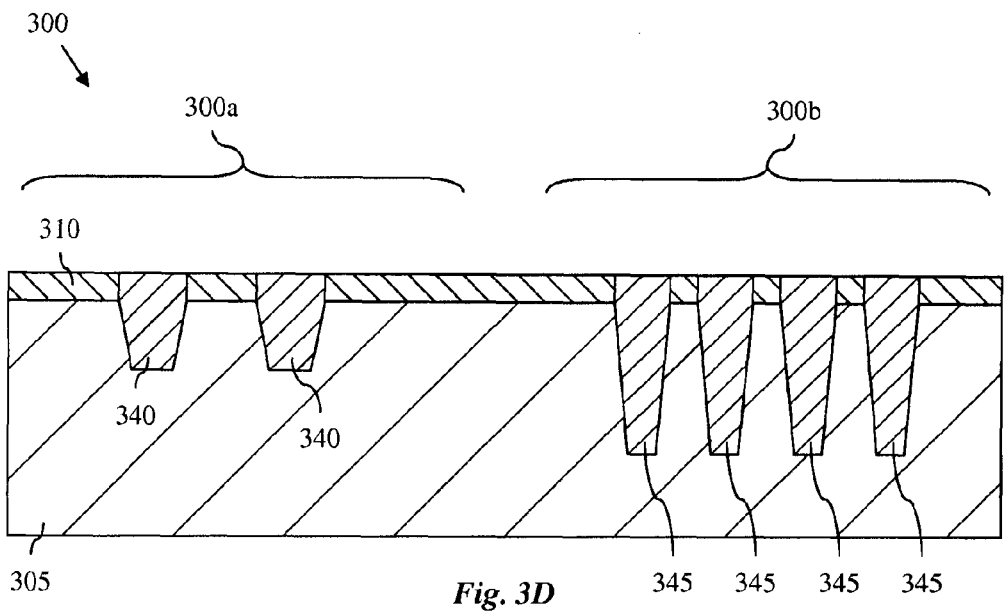
FIG. 3D is a sectional view of the apparatus shown in FIG. 3C in a subsequent stage of manufacture according to one or more aspects of the present disclosure.

Referring to FIG. 3D, illustrated is a sectional view of the apparatus 300 shown in FIG. 3C in a subsequent stage of manufacture in which the layer 335 has been planarized, resulting in the formation of STI features 340 and alignment marks 345. Such planarization may be via one or more CMP, grinding, wet etching, dry etching, and/or other material removal processes. The planarization may be configured such that portions of the layer 335 are removed to the extent that upper surfaces of the resulting STI features 340 and alignment marks 345 are coplanar with the upper surface of the layer 310. In such an embodiment, removal of material from the layer 310 during the planarization may be minimal, minimized or otherwise predetermined (e.g., a portion of the layer 310 may intentionally be removed during the planarization).

Figure 3E:
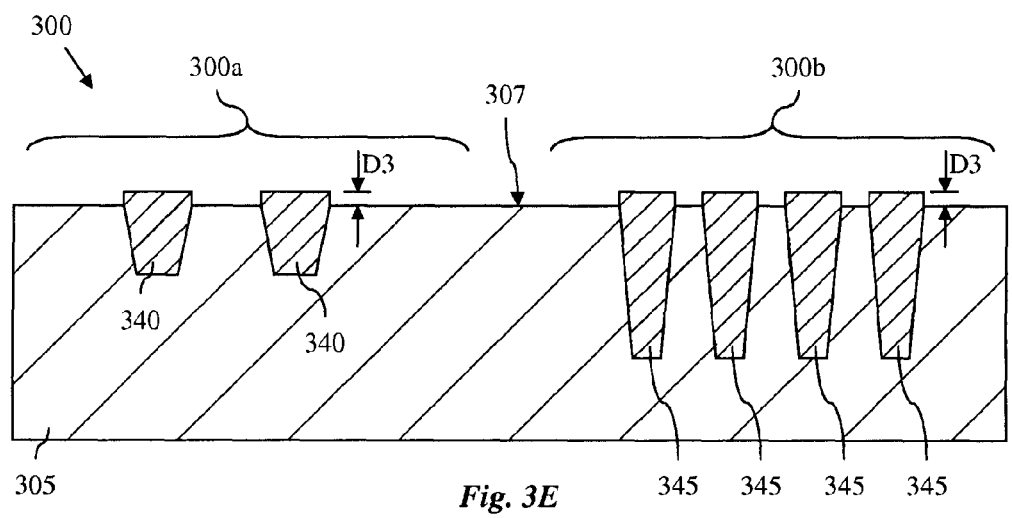
FIG. 3E is a sectional view of the apparatus shown in FIG. 3D in a subsequent stage of manufacture according to one or more aspects of the present disclosure.

Referring to FIG. 3E, illustrated is a sectional view of the apparatus 300 shown in FIG. 3D in a subsequent stage of manufacture in which the layer 310 has been removed. Such removal may be via one or more CMP, grinding, wet etching, dry etching, and/or other material removal processes. In an exemplary embodiment, such as that shown in FIG. 3E, removal of the layer 310 may be configured such that upper portions of the STI features 340 and or upper portions of the alignment marks 345 protrude or extend from the front surface 307 of the substrate 305. For example, the STI features 340 and/or alignment marks 345 may extend above the front surface 307 of the substrate 305 to a distance D3. The distance D3 may range between about 5 nm and about 2000 nm, although other values are also within the scope of the present disclosure.

Figure 3F:
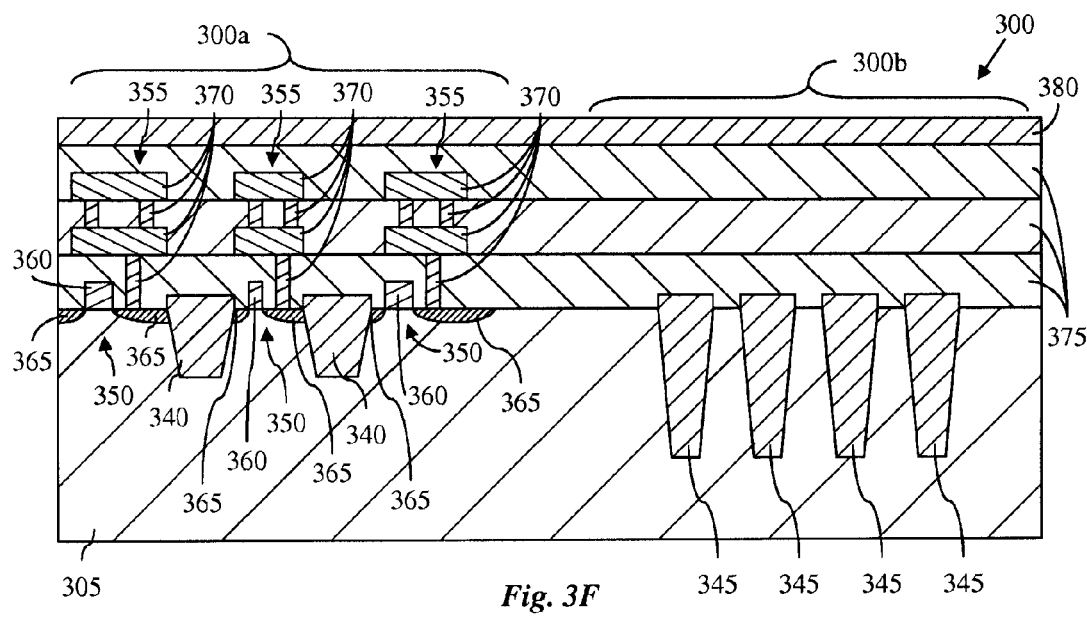
FIG. 3F is a sectional view of the apparatus shown in FIG. 3E in a subsequent stage of manufacture according to one or more aspects of the present disclosure.

Referring to FIG. 3F, illustrated is a sectional view of the apparatus 300 shown in FIG. 3E in a subsequent stage of manufacture in which several manufacturing steps have been performed to complete the one or more devices 350 and/or interconnect structures 355 of the circuit region 300a. For example, one or more of the devices 350 may comprise a gate electrode 360 and source/drain contacts 365, among other possible features, and the interconnect structures 355 may comprise conductive vias and conductors 370 embedded in a plurality of dielectric layers 375. One or more topmost layers 380 of the apparatus 300 may comprise an oxide and/or other materials configured to facilitate subsequent wafer bonding.

Figure 3G:
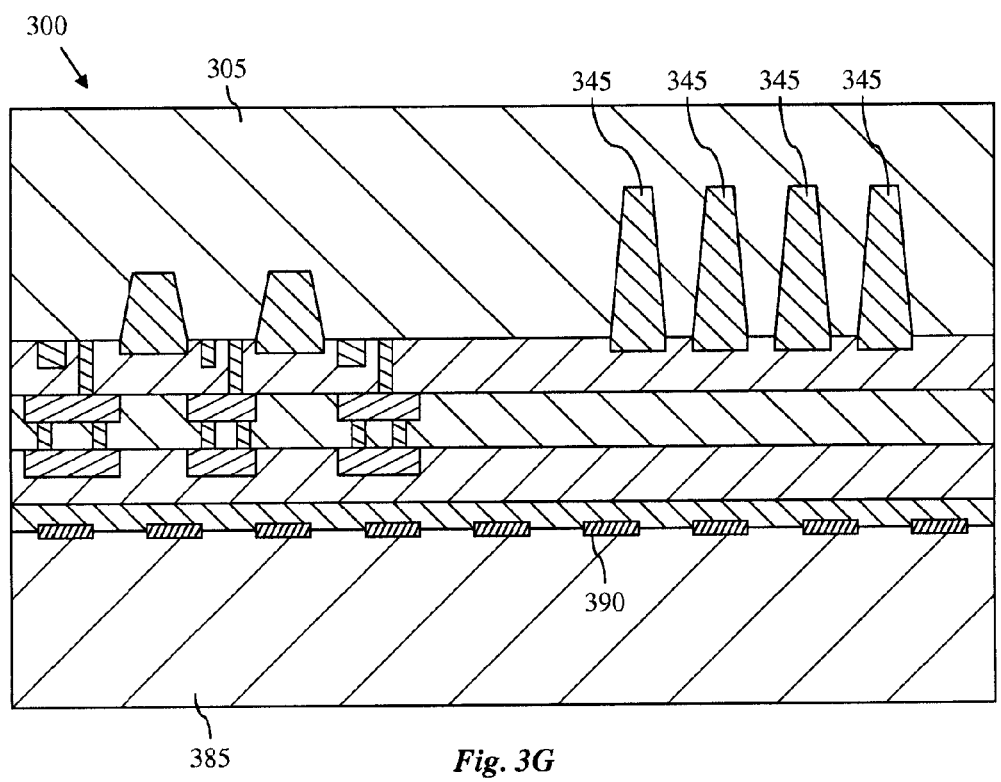
FIG. 3G is a sectional view of the apparatus shown in FIG. 3F in a subsequent stage of manufacture according to one or more aspects of the present disclosure.

Referring to FIG. 3G, illustrated is a sectional view of the apparatus 300 shown in FIG. 3F in a subsequent stage of manufacture in which the apparatus has been flipped (vertically, relative to the page) and coupled to a carrier wafer 385. Such coupling may be via one or more conventional or future-developed wafer bonding processes and/or other coupling methods, possibly including the use of one or more of adhesive, chemical bond, thermal activation and/or curing, or ultrasonic bond, among others. For example, one or more bonding layers 390 (one of which is depicted in the exemplary embodiment shown in FIG. 3G) may be formed on the front surface of the apparatus 300 and/or the carrier wafer 385 to facilitate the wafer bonding.

Figure 3H:
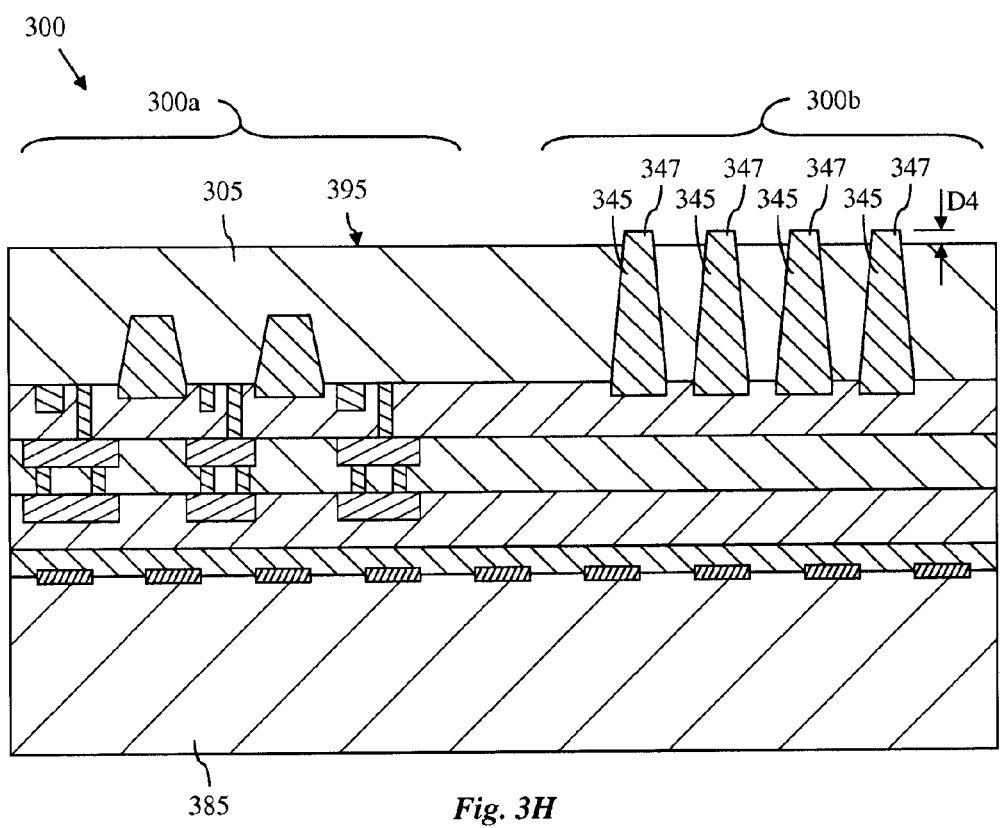
FIG. 3H is a sectional view of the apparatus shown in FIG. 3G in a subsequent stage of manufacture according to one or more aspects of the present disclosure.

Referring to FIG. 3H, illustrated is a sectional view of the apparatus 300 shown in FIG. 3G in a subsequent stage of manufacture in which the backside surface 395 of the substrate 305 has been thinned to expose the previously buried end portions 347 of the alignment marks 345. Such thinning may be accomplished via one or more CMP, grinding, wet etching, dry etching, and/or other material removal processes. The thinning may be configured to expose the end portions 347 of the alignment marks 345 such that the end portions 347 are coplanar with the backside surface 395 of the substrate 305. However, as in the exemplary embodiment depicted in FIG. 3H, the thinning may alternatively be configured such that the end portions 347 extend or protrude from the backside surface 395 of the substrate 305 to a distance D4. The distance D4 may range between about 5 nm and about 2000 nm, although other values are also within the scope of the present disclosure.

Figure 4:
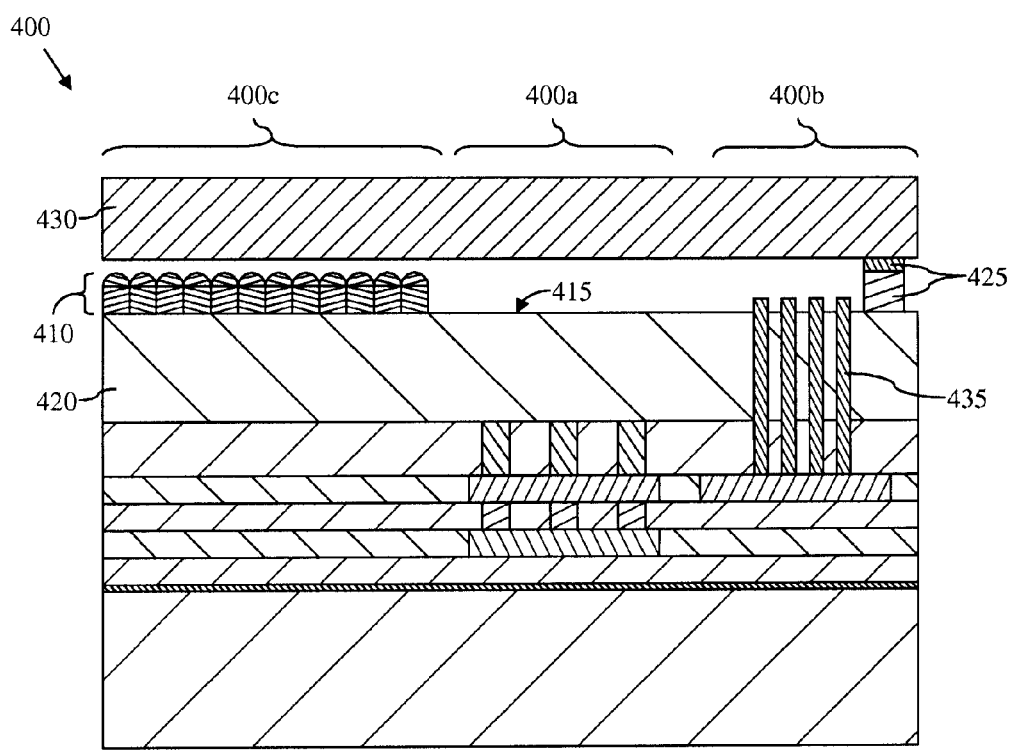
FIG. 4 is a sectional view of at least a portion of apparatus according to one or more aspects of the present disclosure.

Referring to FIG. 4, illustrated is a sectional view of an exemplary embodiment of an apparatus 400 according to one or more aspects of the present disclosure. The apparatus 400 includes an exemplary embodiment of the apparatus 200 shown in FIG. 2C. That is, the apparatus 400 includes a circuit region 400a that is substantially similar in composition and manufacture to the circuit region 200a shown in FIG. 2C, and also includes an alignment mark region 400b that is substantially similar in composition and manufacture to the alignment mark region 200b shown in FIG. 2C. The apparatus 400 further comprises a pixel region 400c in which a microlens and color filter array 410 is formed on the backside surface 415 of the substrate 420 of the apparatus 400. The apparatus 400 may further comprise one or more additional layers 425 interposing the backside surface 415 of the substrate 420 and a glass substrate 430.

Figure 5:
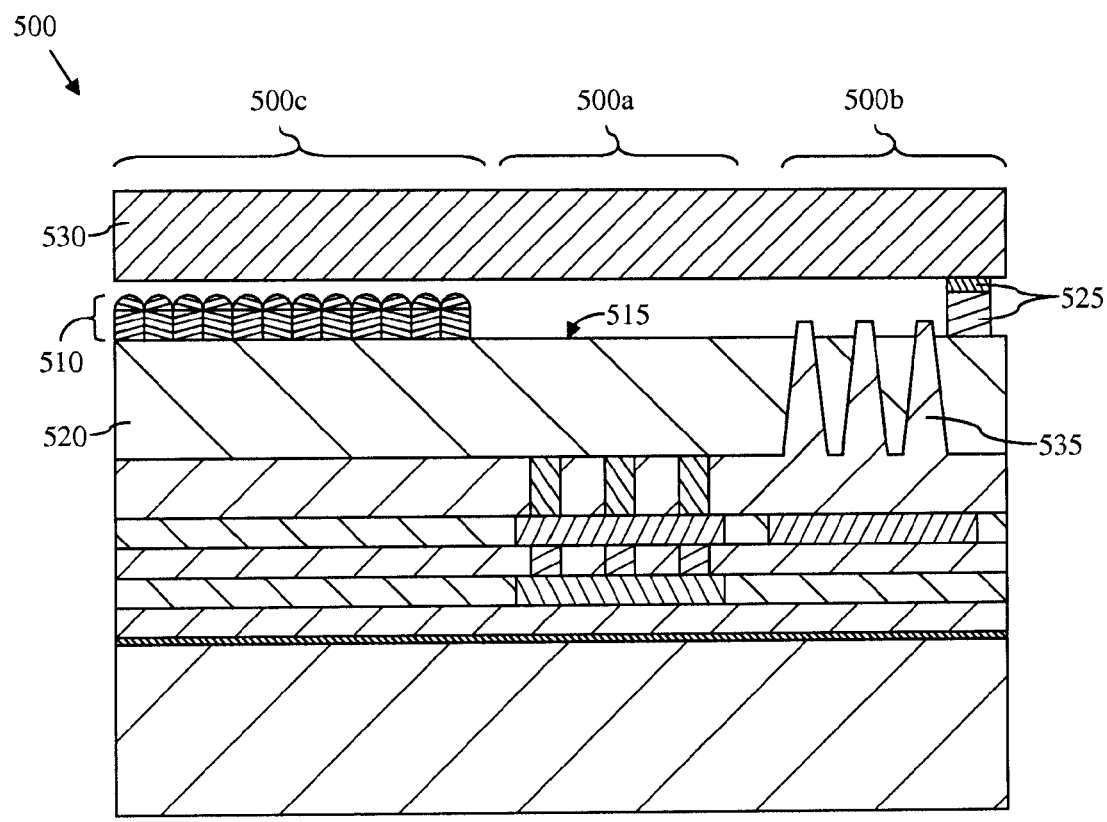
FIG. 5 is a sectional view of at least a portion of apparatus according to one or more aspects of the present disclosure.

Referring to FIG. 5, illustrated is a sectional view of an exemplary embodiment of an apparatus 500 according to one or more aspects of the present disclosure. The apparatus 500 includes an exemplary embodiment of the apparatus 300 shown in FIG. 3H. That is, the apparatus 500 includes a circuit region 500a that is substantially similar in composition and manufacture to the circuit region 300a shown in FIG. 3H, and also includes an alignment mark region 500b that is substantially similar in composition and manufacture to the alignment mark region 300b shown in FIG. 3H. The apparatus 500 further comprises a pixel region 500c in which a microlens and color filter array 510 is formed on the backside surface 515 of the substrate 520 of the apparatus 500. The apparatus 500 may further comprise one or more additional layers 525 interposing the backside surface 515 of the substrate 520 and a glass substrate 530.

Manufacture of the array 410 shown in FIG. 4 and/or the array 510 shown in FIG. 5 may be facilitated by one or more alignment processes utilizing alignment marks 435 formed in alignment mark region 400b and/or alignment marks 535 formed in alignment mark region 500b, respectively, perhaps in accord with one or more aspects of the method 100 shown in FIG. 1A, the method 115 shown in FIG. 1B, the manufacture of the apparatus 200 as represented in FIGS. 2A-2C, and/or the manufacture of the apparatus 300 as represented in FIGS. 3A-3H. For example, such alignment marks and/or processes may result in a reduction of overlay tolerance, perhaps from several hundred nanometers to less than about 40 nm. Such alignment marks and/or processes may also or alternatively result in significantly increased pixel performance.

Figure 6A:
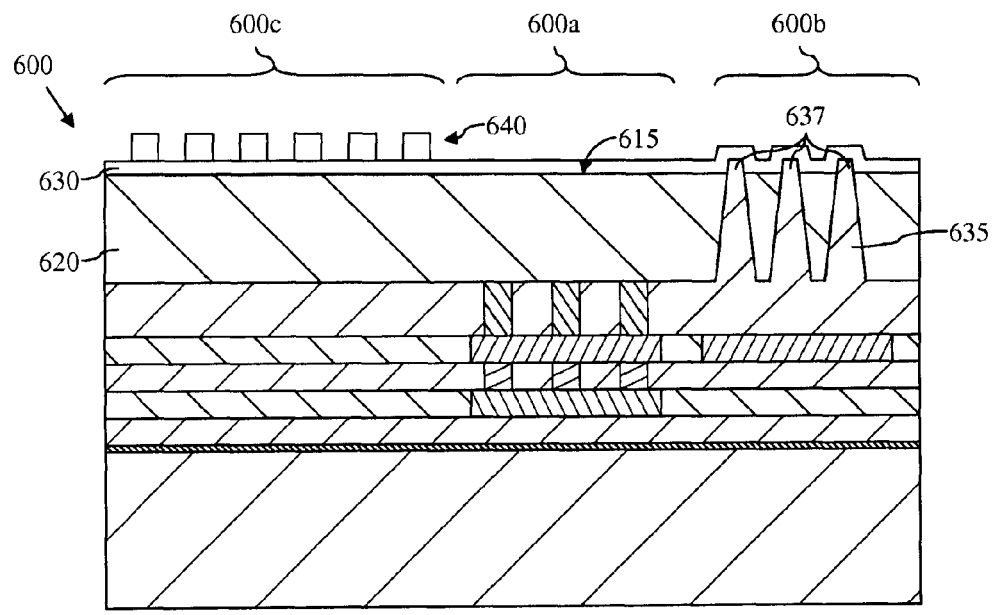
FIG. 6A is a sectional view of at least a portion of apparatus in an intermediate stage of manufacture according to one or more aspects of the present disclosure.

Referring to FIG. 6A, illustrated is a sectional view of an apparatus 600 in an intermediate stage of manufacture according to one or more aspects of the present disclosure. The apparatus 600 includes an exemplary embodiment of the apparatus 300 shown in FIG. 3H. That is, the apparatus 600 includes a circuit region 600a that is substantially similar in composition and manufacture to the circuit region 300a shown in FIG. 3H, and also includes an alignment mark region 600b that is substantially similar in composition and manufacture to the alignment mark region 300b shown in FIG. 3H. The apparatus 600 further comprises a pixel region 600c in which a microlens and color filter array is to be formed on the backside surface 615 of the substrate 620 of the apparatus 600.

Figure 6B:
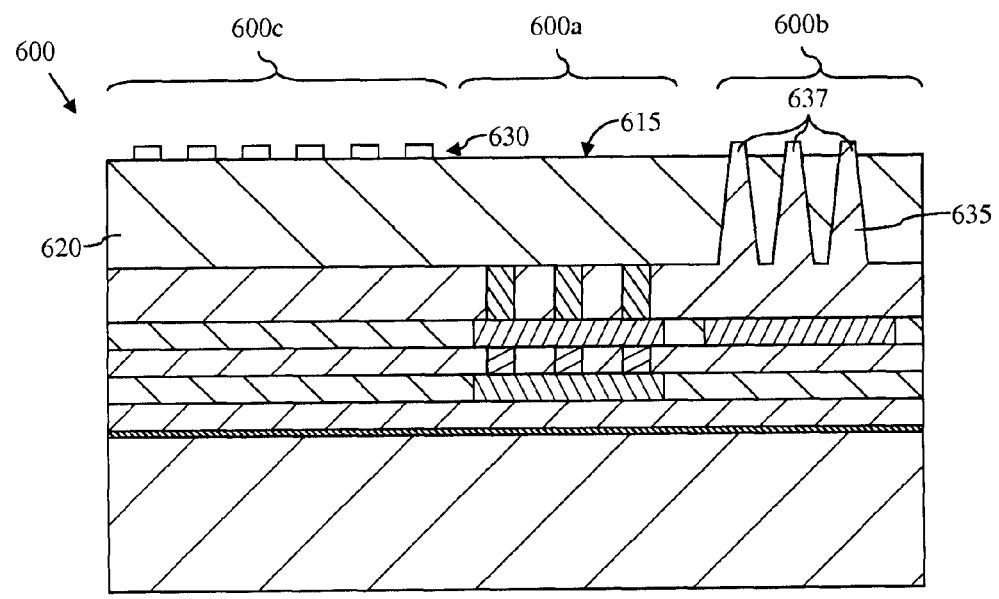
FIG. 6B is a sectional view of the apparatus shown in FIG. 6A in a subsequent stage of manufacture according to one or more aspects of the present disclosure.

In the manufacturing stage depicted in FIG. 6A, a shielding material layer 630 has been deposited over the backside surface 615 of the substrate 620. The shielding layer 630 is deposited in such a manner that is substantially conforms to the aggregate profile of the backside surface 615 of the substrate 620 and the exposed ends 637 of the alignment marks 635 protruding from the backside surface 615. If conventional backside illumination sensors were to be utilized during the one or more alignment steps required during formation of the pixel array, accurate alignment would be difficult or impossible because the material of the shielding layer 630 is often impervious to the transmission of light energy introduced by the optical sensing apparatus. However, according to one or more aspects of the present disclosure, in embodiments in which the alignment marks 635 protrude from the backside surface 615 of the substrate 620, the difference in step-height of the shielding layer 630 over the protruding portions 637 of the alignment marks 635, relative to the backside surface 615, can be detected by the optical sensing apparatus. Consequently, in a subsequent stage of manufacture as depicted in the sectional view of FIG. 6B, the patterned photoresist layer 640 employed in the manufacture of the pixel array can be accurately aligned.

In view of all of the above and the figures, it should be evident to those of skill in the art that the present disclosure introduces an apparatus comprising an integrated circuit located in a first region of a substrate having first and second opposing major surfaces, as well as an alignment mark located in a second region of the substrate and extending through the substrate between the first and second surfaces. The alignment mark may protrude from one of the first and second surfaces, and may protrude from each of the first and second surfaces. The alignment mark may comprise a plurality of alignment marks each extending through the substrate between the first and second surfaces. The second region may interpose the first region and a perimeter of the substrate. The second region, but not the first region, may comprise a scribe region.

The present disclosure also introduces a method of forming an alignment mark comprising forming a recess in a first substrate, wherein the first substrate includes first and second opposing major surfaces, wherein a plurality of transistors are located in a first region of the first surface, and wherein forming the recess includes forming the recess in a second region of the first surface. The recess is filled with a material, and the material within the recess is then planarized. The method further comprises coupling the first substrate to a second substrate such that the first surface of the first substrate is closer to the second substrate relative to the second surface of the first substrate, and thinning the first substrate by planarizing the second surface of the first substrate at least until the material in the recess is exposed. The material may substantially comprise a metallic composition, and the method may further comprise depositing an isolation layer in the recess prior to filling the recess with the material. The material may have a higher resistance to chemical-mechanical planarizing relative to a bulk portion of at least one of the first and second substrates. Forming the recess may comprise forming a plurality of recesses in the second region, filling the recess may comprise filling each of the plurality of recesses with the material, planarizing the material may comprise planarizing the material within each of the plurality of recesses, and thinning the first substrate may comprise planarizing the second surface of the first substrate at least until the material in each of the plurality of recesses is exposed. The second region, but not the first region, may comprise a scribe region.

The present disclosure also provides a method of forming an alignment mark comprising depositing a first layer over a first substrate, forming a first aperture in the first layer, and etching the first substrate through the first aperture to form a first recess extending into the first substrate to a first depth. Such method further comprises forming a second aperture in the first layer, and etching the first substrate through the second aperture to form a second recess extending into the first substrate to a second depth, wherein the second depth is substantially less than the first depth. The method further comprises filling the first and second recesses with a material, planarizing the material in the first and second recesses, depositing a second layer over the planarized material in the first and second recesses, coupling the first substrate to a second substrate such that the first and second substrates are separated by at least a portion of at least the second layer, and thinning the first substrate by planarizing a backside surface of the first substrate at least until the material in the first recess is exposed. Coupling the first substrate to the second substrate may comprise wafer-to-wafer bonding of the first and second substrates. Thinning the first substrate may comprise grinding the backside surface of the first substrate. Thinning the first substrate may comprise at least one wet etch process configured to etch the backside surface of the first substrate at a rate that is faster relative to an etch rate of the material. Thinning the first substrate may comprise planarizing the backside surface of the first substrate until the material in the first recess protrudes from the backside surface by an amount ranging between about 5 nm and about 2000 nm. Forming the first aperture may comprise forming the first aperture in a first region of the first substrate, wherein forming the second aperture may comprise forming the second aperture in a second region of the first substrate, and wherein the first region, but not the second region, may comprise a scribe region. The method may further comprise removing the first layer before at least one of: depositing the second layer; coupling the first substrate to the second substrate; and thinning the first substrate. After the first layer is removed, the material in each of the first and second recesses may protrude from the first substrate in a first direction and the material in the first recess may protrude from the first substrate in a second direction that is substantially opposite to the first direction. The material may substantially comprise a dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
providing a substrate having a first region and second region, wherein the first region includes an integrated circuit;
forming a recess in the second region of the substrate;
forming a material within the recess in the second region of the substrate;
forming another material within the recess, the another material being different than the material within the recess; and
removing a portion of the substrate to expose a portion of the material, wherein the exposed material is an alignment mark.

2. The method of claim 1, wherein the material includes a conductive material and the another material includes a dielectric material.

3. The method of claim 1, further comprising coupling the substrate to another substrate prior to removing the portion of the substrate to expose the portion of the material.

4. The method of claim 1, further comprising forming another recess in the first region; and
forming the material within the another recess.

5. The method of claim 4, wherein the recess extends a first depth within the substrate and the another recess extends a second depth that is different than the first depth.

6. The method of claim 1, further comprising forming another material over the second region of the substrate prior to forming the recess in the second region; and
removing the another material over the second region of the substrate after forming the material within the recess in the second region of the substrate to expose another portion of the material within the recess.

7. A method comprising:
forming a first recess in a semiconductor substrate, the first recess extending to a first depth in the semiconductor substrate;

forming a second recess in the semiconductor substrate, the second recess extending to a second depth in the semiconductor substrate, the second depth is different than the first depth;

forming a material within the first and second recesses; and removing a portion of the semiconductor substrate to expose a portion of the material within the first recess.

8. The method of claim 7, wherein the material includes a dielectric material.

9. The method of claim 7, wherein the semiconductor substrate has a front side and opposing back side, wherein forming the first recess in the semiconductor substrate includes forming the first recess in the front side of the semiconductor substrate, and wherein removing the portion of the semiconductor substrate to expose the portion of the material within the first recess includes removing the portion from the back side of the semiconductor substrate.

10. The method of claim 7, wherein removing the portion of the semiconductor substrate to expose the portion of the material within the first recess includes performing an etching process to remove the portion of the semiconductor substrate.

11. The method of claim 7, wherein removing the portion of the semiconductor substrate to expose the portion of the material within the first recess includes performing one of a chemical mechanical polishing process and a grinding process to remove the portion of the semiconductor substrate.

12. The method of claim 7, further comprising forming another material over the semiconductor substrate prior to forming the material within the first and second recesses; and removing the another material over the semiconductor substrate after forming the material within the first and second recesses to expose the material within the first and second recesses.

13. The method of claim 7, wherein the material in the first recessed forms an alignment mark and the material in the second recess forms a shallow trench isolation feature.

14. A method comprising:

providing a substrate having a first surface opposing a second surface and first and second regions extending between the first and second surfaces, wherein the first region includes an integrated circuit;

forming an alignment mark in the second region of the substrate, wherein the alignment mark is exposed through at least one of the first and second surfaces of the substrate;

forming an interconnect structure formed over the first surface of the substrate; and forming a pixel array over the second surface of the substrate.

15. The method of claim 14, wherein forming the alignment mark in the second region of the substrate includes:

forming a recess through the first surface of the substrate;

forming a material within the recess; and removing a portion of the substrate from the second surface of the substrate.

16. The method of claim 15, wherein the material is conductive.

17. The method of claim 15, further comprising forming another recess in the first region; and forming the material within the another recess, wherein the recess extends to a first depth within the substrate and the another recess extends to a second depth that is different than the first depth.

18. The method of claim 17, wherein a top surface of the material in the recess and a top surface of the material in the another recess are substantially coplanar.

19. The method of claim 1, wherein the material includes a dielectric material.

20. The method of claim 1, further comprising forming an interconnect structure formed over a first surface of the substrate; and forming a pixel array over a second surface of the substrate that is opposite the first surface.

* * * * *